United States Patent
Worley

(10) Patent No.: US 7,746,606 B2
(45) Date of Patent: Jun. 29, 2010

(54) ESD PROTECTION FOR INTEGRATED CIRCUITS HAVING ULTRA THIN GATE OXIDES

(75) Inventor: Eugene R. Worley, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 795 days.

(21) Appl. No.: 10/990,641

(22) Filed: Nov. 16, 2004

(65) Prior Publication Data
US 2005/0152081 A1   Jul. 14, 2005

Related U.S. Application Data

(60) Provisional application No. 60/535,993, filed on Jan. 12, 2004.

(51) Int. Cl.
*H02H 9/00* (2006.01)
*H02H 3/20* (2006.01)

(52) U.S. Cl. .................... 361/56; 361/91.1
(58) Field of Classification Search ............. 361/56, 361/111, 91.1
See application file for complete search history.

(56) References Cited

U.S. PATENT DOCUMENTS

| | | | | |
|---|---|---|---|---|
| 5,300,840 A * | 4/1994 | Drouot | ............ | 327/51 |
| 5,717,559 A * | 2/1998 | Narita | ............ | 361/56 |
| 6,011,681 A * | 1/2000 | Ker et al. | ............ | 361/111 |
| 6,144,542 A * | 11/2000 | Ker et al. | ............ | 361/111 |
| 6,262,616 B1 * | 7/2001 | Srinivasan et al. | ............ | 327/264 |
| 6,420,905 B1 * | 7/2002 | Davis et al. | ............ | 326/113 |
| 6,437,407 B1 * | 8/2002 | Ker et al. | ............ | 257/357 |
| 6,459,555 B1 * | 10/2002 | Welbers et al. | ............ | 361/91.1 |
| 6,667,648 B2 * | 12/2003 | Stout et al. | ............ | 327/333 |
| 6,717,453 B2 * | 4/2004 | Aoki | ............ | 327/333 |
| 7,365,573 B2 * | 4/2008 | Okada | ............ | 326/86 |
| 2005/0270712 A1 * | 12/2005 | Huang et al. | ............ | 361/90 |

\* cited by examiner

*Primary Examiner*—Robert DeBeradinis
*Assistant Examiner*—Scott Bauer
(74) *Attorney, Agent, or Firm*—Farjami & Farjami LLP

(57) ABSTRACT

According to an exemplary embodiment, an integrated circuit includes a first circuit block having a first power bus. The integrated circuit further includes a second circuit block having a second power bus, where the first power bus is isolated from the second power bus. The integrated circuit further includes a first dedicated ESD bus, where the first dedicated ESD bus provides a discharge path from the first power bus to the second power bus and from the second power bus to the first power bus. The first power bus can be coupled to the first dedicated ESD bus by a first pair to bi-directional diodes, and the second power bus can be coupled to the first dedicated ESD bus by a second pair of bi-directional diodes.

6 Claims, 6 Drawing Sheets

ESD PROTECTION FOR INTEGRATED CIRCUITS HAVING ULTRA THIN GATE OXIDES

The present application claims priority to a pending provisional patent application entitled "ESD Protection for Integrated Circuits Having Ultra Thin Gate Oxides" invented by Eugene R. Worley, Ser. No. 60/535,993 filed on Jan. 12, 2004. The disclosure in that pending provisional application is hereby incorporated fully by reference into the present application.

BACKGROUND OF THE INVENTION

1. Field of the Invention

The present invention is generally in the field of integrated circuits. More specifically, the invention is in the field of ESD protection for integrated circuits.

2. Related Art

In a mixed signal integrated circuit (IC), power connections to various circuit blocks within the IC are typically independent of each other to reduce noise coupling. Power that feeds a particular circuit block in the IC is referred to as a "power domain" in the present application. Signal lines are typically required to connect a circuit block with an independent power bus to another circuit block. Thus, under normal operating conditions, only signal lines connect a circuit block of one power domain to the circuit block of another power domain. However, unless the power domains are linked together, gate oxide of input logic in the circuit blocks can be ruptured by a large voltage drop that can occur between power domains in an electrostatic discharge (ESD) event.

In a conventional approach, back-to-back diodes are placed between the power buses of the various power domains to isolate the power domains during normal operation yet link the power domains together during an ESD event. However, during an ESD event, an ESD discharge path can cross many power domains and, thereby, cause multiple diode voltage drops across the back-to-back diodes that are situated between the power domains. The multiple diode voltage drops, along with voltage drops resulting from power bus resistance, can significantly damage gate oxide of circuit block input logic. Thus, the conventional approach of placing back-to-back diodes between power buses of the power domains in an IC does not provide effective gate oxide protection during an ESD event.

Thus, there is a need in the art for effective ESD protection for gate oxide in circuit blocks with independent power domains in an integrated circuit.

SUMMARY OF THE INVENTION

The present invention is directed to ESD protection for integrated circuits having ultra thin gate oxides. The present invention addresses and resolves the need in the art for effective ESD protection for gate oxide in circuit blocks with independent power domains in an integrated circuit.

According to an exemplary embodiment, an integrated circuit includes a first circuit block having a first power bus. The integrated circuit further includes a second circuit block having a second power bus, where the first power bus is isolated from the second power bus. The integrated circuit further includes a first dedicated ESD bus, where the first dedicated ESD bus provides a discharge path from the first power bus to the second power bus and from the second power bus to the first power bus. The first power bus can be coupled to the first dedicated ESD bus by a first pair to bi-directional diodes, and the second power bus can be coupled to the first dedicated ESD bus by a second pair of bi-directional diodes.

According to this exemplary embodiment, the first circuit block can include a third power bus and the second circuit block can include a fourth power bus, where the third power bus is isolated from the fourth power bus. The integrated circuit can further include a second dedicated ESD bus, where the third power bus is coupled to the second dedicated ESD bus by a third pair of bi-directional diodes and the fourth power bus is coupled to the second dedicated ESD bus by a fourth pair of bi-directional diodes. The integrated circuit can further include an ESD bus clamp, where the ESD bus clamp is situated between the first dedicated ESD bus and the second dedicated ESD bus. Other features and advantages of the present invention will become more readily apparent to those of ordinary skill in the art after reviewing the following detailed description and accompanying drawings.

DETAILED DESCRIPTION OF THE INVENTION

The present invention is directed to ESD protection for integrated circuits having ultra thin gate oxides. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
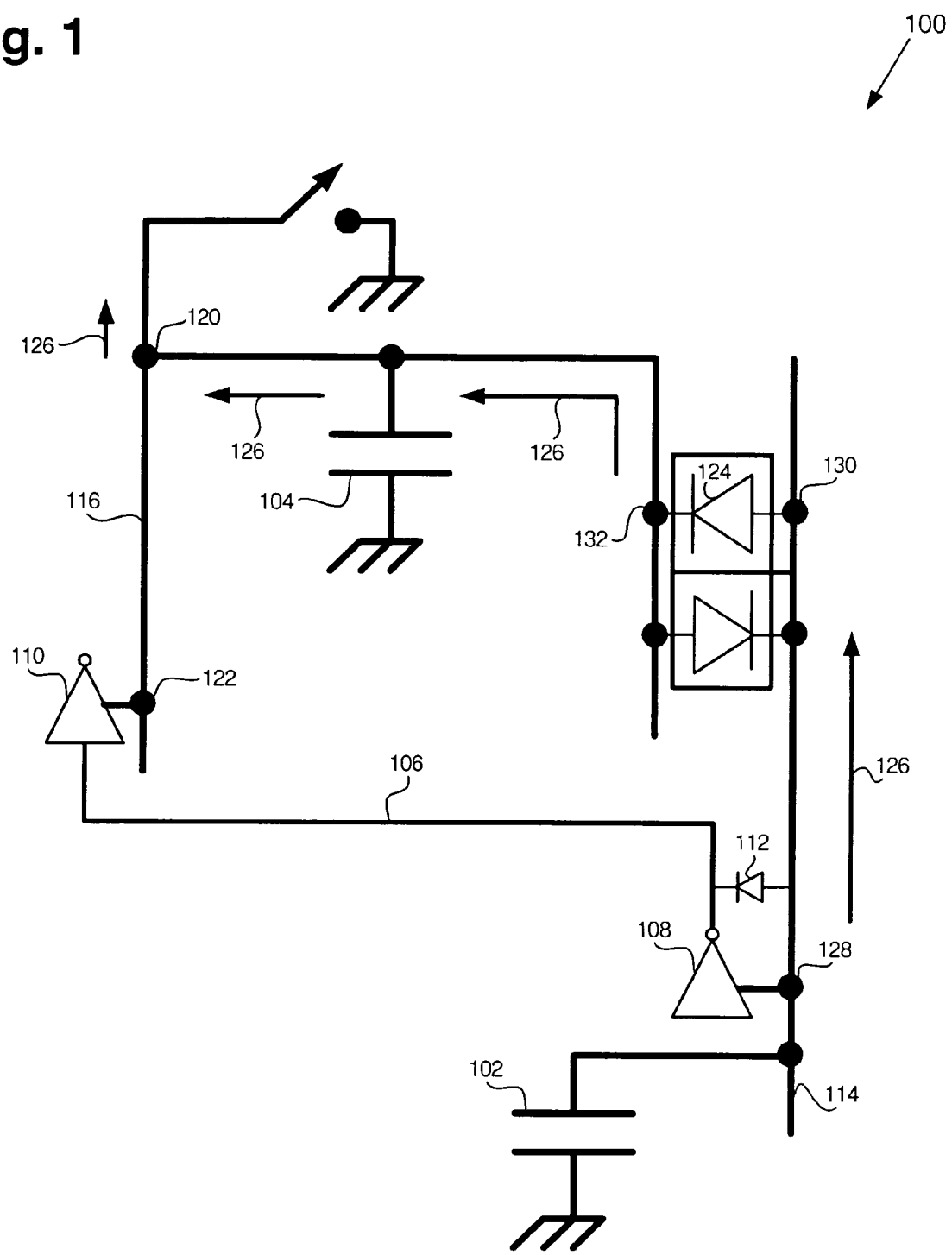
FIG. 1 illustrates a circuit diagram of an exemplary circuit including a discharge path between independent power buses during a CDM discharge.

FIG. 1 shows an exemplary diagram illustrating a current path and voltage drops of a charge device model (CDM) discharge. As shown in circuit 100, which can be a portion of an IC, a worst-case situation occurs when a large area block, such as a digital circuit, with a significant block-to-tester plate capacitance, i.e. CDM capacitance 102, is connected to a small area block, such as an analog circuit, with a small block to CDM plate capacitance, i.e. CDM capacitance 104. Although the CDM capacitance is actually distributed, it is shown as a lumped capacitance, i.e. CDM capacitance 102 and CDM capacitance 104, in the present example for illustration purposes. Also shown in circuit 100 in FIG. 1 is a signal connection represented by line 106, which connects the output of inverter 108 in one circuit block to the input of inverter 110 in another circuit block.

Consider an example when a positive charge exists on the chip relative to the CDM tester plate. Diode 112 represents the parasitic drain/substrate diode of an NFET of inverter 108 that can couple Vss power bus 114 to signal line 106. The worst-case discharge occurs from the analog power pin to the CDM plate or ground. Because of the small analog domain CDM capacitance, i.e. CDM capacitance 104, node 120 of Vss power bus 116 rapidly discharges to ground with the Vss potential of inverter 110 at node 122 going to ground potential very early in the discharge. As shown in FIG. 1, CMD capacitance 102 must discharge through the resistance of Vss power bus 114, the resistance of Vss power bus 116, and diode 124, as shown by arrows 126. Consider the example when the effective resistance between nodes 128 and 130 is 1.0 ohm ($\Omega$) for the lumped capacitance, i.e. CDM capacitance 102, the "on" resistance of diode 124 is 0.25$\Omega$, and the resistance between node 132 and Vss power bus 116 is 1.0$\Omega$. For a five-ampere discharge current and a diode offset voltage of 1.1V, the voltage drop from node 128 to node 122 is 12.35V, a voltage high enough to rupture oxide having a thickness of 20.0 Angstroms.

Thus, the above example showed how even small bus resistances in the discharge path can make thin gate oxides of power domain to power domain interface gates susceptible to gate oxide rupture during a CDM event.

To understand the susceptibility of inter domain interface circuit gates to ESD it is first necessary to examine the failure criteria for gate oxides. The following gate oxide rupture equation can be applied for rectangular pulses:

$$V_g - V_{offset} = 4.31 \cdot T_{ox} / \ln(1792 \cdot t_{pulse}) \quad \text{Equation (1)}$$

where $T_{ox}$=oxide thickness in Angstroms (Å), $t_{pulse}$=pulse width in nanoseconds (ns). Using a 100.0 ns transmission line pulse (TLP), it was found that for NFETs with a 20.0 Å gate oxide thickness, the average gate oxide rupture was 5.9V for a positive pulse and for PFETs with a 20.0 Å gate oxide thickness, the average gate oxide rupture was 7.0V for a negative pulse. Thus, the offset term is 1.2V for 20.0 Å NFETs, i.e. NFETs having a gate oxide thickness of 20.0 Å, and 0.1V for 20.0 Å PFETs, i.e. PFETs having a gate oxide thickness of 20.0 Å. Thus, for a 1.0 ns CDM pulse the rupture voltage for a 20.0 Å NFET oxide is 10.3V.

Equation (1), however, cannot be used to predict the peak rupture voltage for an HBM waveform. Since the electric fields in ultra-thin oxides during ESD stress are very high, conduction through the oxide is dominated by Fowler-Nordheim (FN) tunneling and not by direct tunneling. If it is assumed that an accumulated charge threshold causes breakdown and that the charge conduction is approximately exponential with 1/Eox as indicated in the FN conduction equation, then it can be inferred that:

$$t_0 = \int_0^{t_{rupture}} e^{\frac{at_{ox}}{V_{g(t)} - V_{offset}}} dt \quad \text{Equation (2)}$$

where $t_o$=5.58×10$^{-13}$ sec. Note that integration of Equation (2) results in Equation (1) for a positive rectangular pulse. Equation (1) was numerically integrated for a 20.0 Å NFET oxide using an HBM waveform with a linear rise time of 8.0 ns and an exponential fall time constant of 150.0 ns, resulting in a peak breakdown voltage of 7.3V. Thus, for a 2.0 kilovolt (kV) HBM discharge and an oxide thickness of 20.00 Å, a path resistance of 4.65$\Omega$ and a series diode offset voltage of 1.1V will cause failure.

If it were assumed that for ultra-thin oxides Equation (2) is still valid, then for 12.0 Å NFET oxides the failure voltage would be 5.7V for a 1.0 ns rectangular pulse and 3.9V peak for an HBM pulse. Thus, for 12.0 Å NFET oxides and an assumed series diode offset voltage of 1.1V, only 2.0$\Omega$ maximum could be allowed in the discharge path to pass 2.0 kV HBM. Thus, ultra-thin oxides pose an HBM threat as well as a CDM threat for domain-to-domain interface gates.

Figure 2:
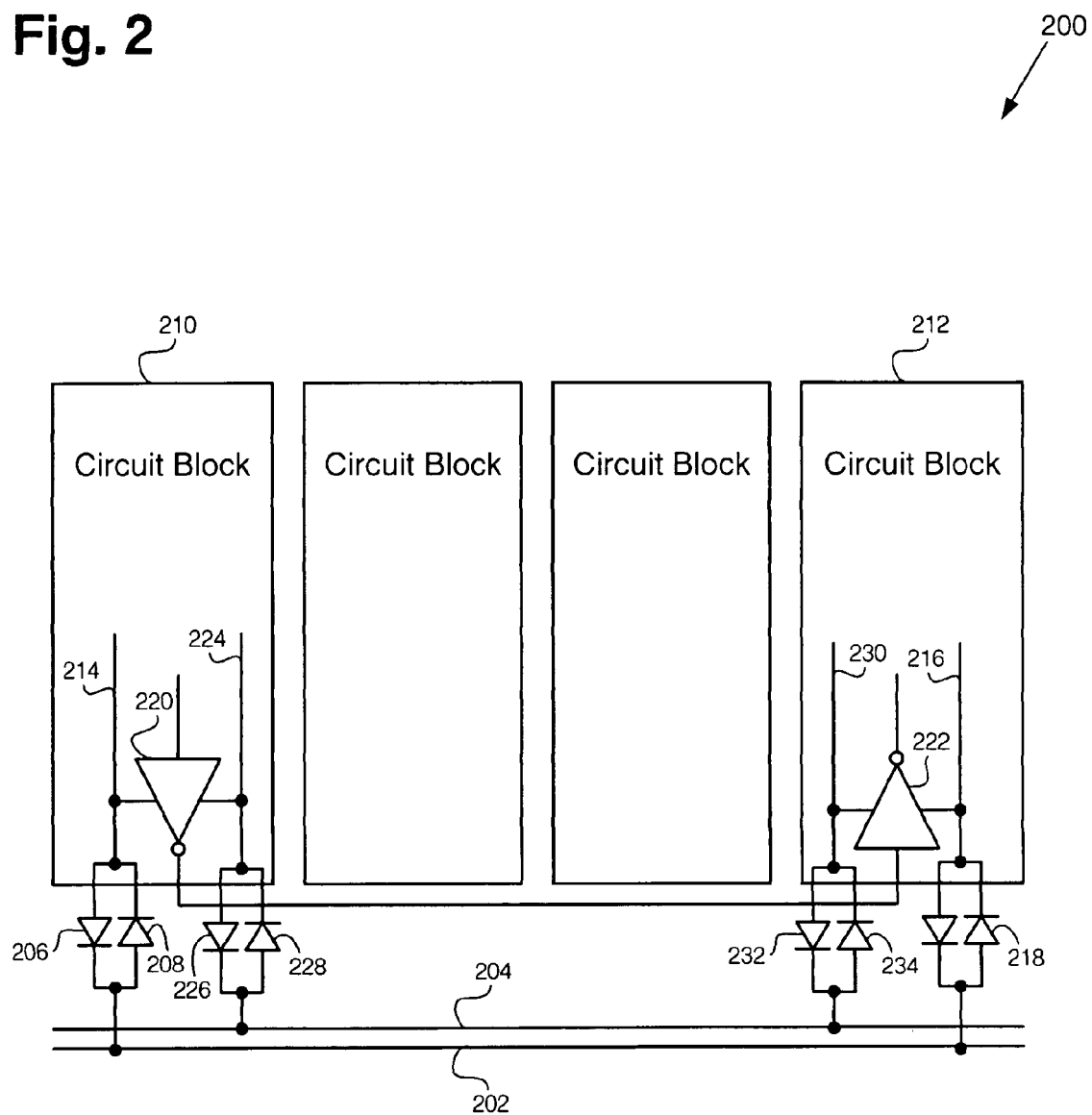
FIG. 2 illustrates a circuit diagram of an exemplary ESD network in an integrated circuit in accordance with one embodiment of the present invention.

FIG. 2 shows a diagram of an exemplary ESD network for circuit blocks with isolated power domains in accordance with one embodiment of the present invention. In circuit 200, which can be a portion of an IC, two dedicated ESD buses are used, i.e. Vss ESD bus 202 and Vdd ESD bus 204, which can also be used as global power buses. A pair of bi-directional diodes, such as diode 206 and diode 208, are used to couple the power buses of circuit blocks, such as circuit blocks 210 and 212, to the respective ESD buses. It is noted that in the present application, a "pair of bi-directional diodes" is defined as two diodes coupled such that the anode of the first diode is coupled to the cathode of the second diode and the cathode of the first diode coupled to the anode of the second diode. An HBM discharge from Vss power bus 214 in circuit block 210 to the Vss power bus 216 in circuit block 212 would entail voltage drops across two diodes, i.e. diodes 206 and 218, and a bus drop across Vss ESD bus 202. For an oxide thickness of 12.0 Å, HBM requirement of 2.0 kV, and a diode offset voltage of 1.1V, this means that the resistance of a portion of Vss ESD bus 202 situated between circuit block 210 and circuit block 212 cannot be greater than 1.3$\Omega$ for this configuration.

Furthermore, there can be bus drops internal to circuit blocks 210 and 212. Note that there can be a fan out of the output of inverter 220 with receiver inverters or circuit gates being distributed within circuit block 212. In order to minimize drops internal to circuit blocks 210 and 212, inverter 220 should be placed as close to Vss ESD bus 202 and Vdd ESD bus 204 as possible and a single receiver, such as inverter 222, should also be placed as close to Vss ESD bus 202 and Vdd ESD bus 204 as possible. For a fan out of a signal from inverter 220 into circuit block 212, inverter 222 can be used as a buffer to eliminate any internal drops on Vss power bus 216 from being added to the ESD voltage appearing on circuit gates receiving the signal from inverter 220. Also shown in FIG. 2, Vdd power bus 224 in circuit block 210 is coupled to Vdd ESD bus 204 by diodes 226 and 228, and Vdd power bus 230 is coupled to Vdd ESD bus 204 by diodes 232 and 234.

Figure 3:
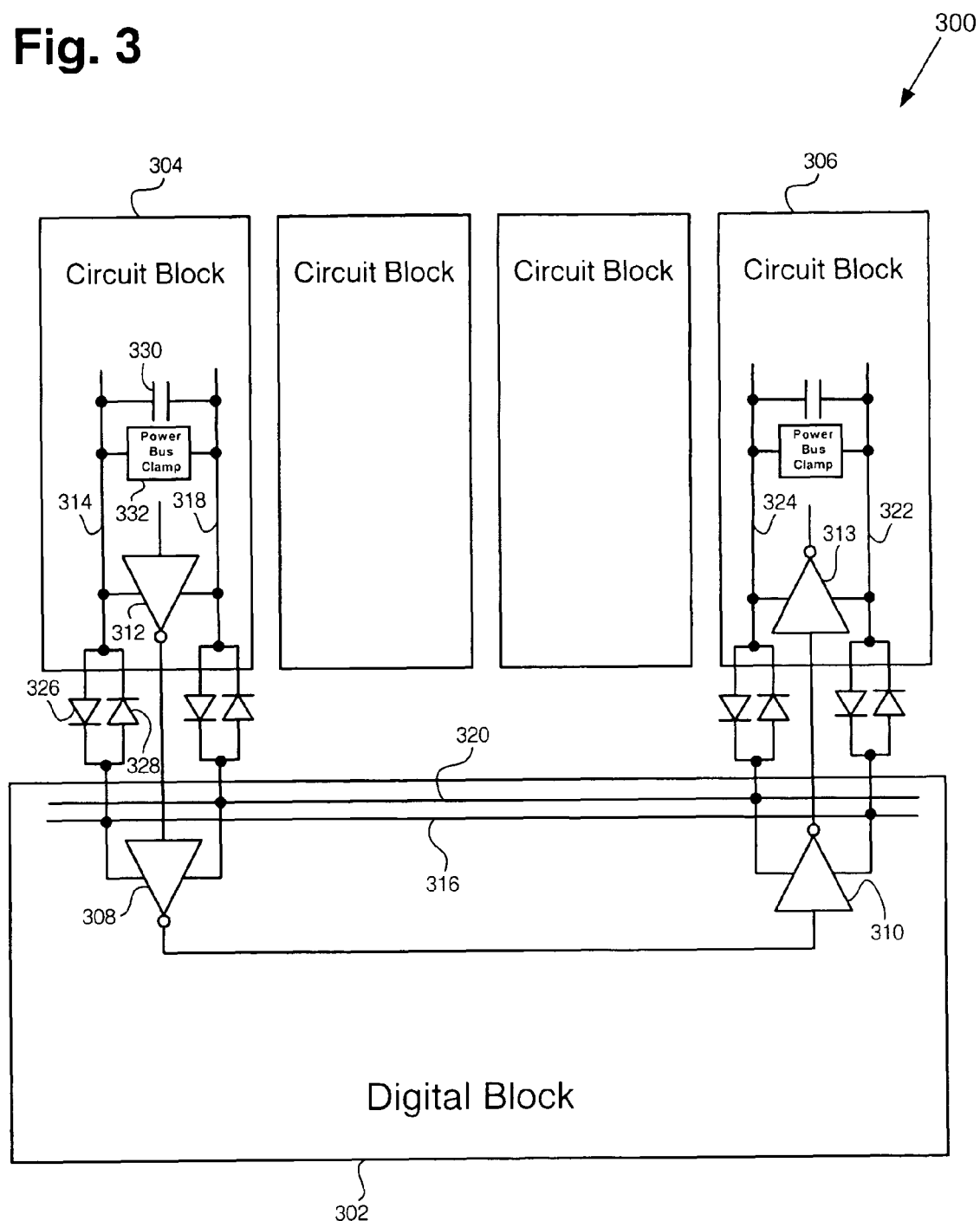
FIG. 3 illustrates a circuit diagram of an exemplary digital block coupling circuit blocks in an integrated circuit in accordance with one embodiment of the present invention.

FIG. 3 shows a diagram of an exemplary circuit where a digital circuit block spans a distance between a transmitting circuit block and a receiving circuit block in accordance with one embodiment of the present invention. In circuit 300, which can be a portion of an integrated circuit, digital circuit block 302, which is also referred to as a "digital block" in the present application, is used as a transport block for a signal being transmitted from circuit block 304 to circuit block 306. That is, the digital circuit block 302 contains both a receiving gate, i.e. inverter 308, and a transmitting gate, i.e. inverter 310, for a signal from inverter 312 of circuit block 304. Note that the voltage difference between Vss power bus 314 in circuit block 304 and Vss power bus 316 in digital circuit block 302 and the voltage difference between Vdd power bus 318 in circuit block 304 and Vdd power bus 320 in digital circuit block 302 is only one diode drop. The same is true for the voltage difference between Vss power bus 322 in circuit block 306 and Vss power bus 316 in digital circuit block 302 and between Vdd power bus 324 in circuit block 306 and Vdd power bus 320 in digital circuit block 302. It is noted that Vss power bus 322 and Vdd power bus 324 are each also referred to as a "digital block power bus" in the present application. As shown in FIG. 3, pairs of bi-directional diodes, such as diodes 326 and 328, couple Vss power bus 316 to Vss power buses 314 and 322 and couple Vdd power bus 320 to Vdd power buses 318 and 324.

The worst case HBM discharge would be a discharge from a Vdd power bus to a Vss power bus, such as a discharge from Vdd power bus 318 in circuit block 304 to Vss power bus 322 in digital circuit block 306. In this case the voltage that could appear on the input of inverter 308 would be a bypass capacitor/power bus clamp drop, e.g., a drop across bypass capacitor 330/power bus clamp 332, plus a diode drop, e.g., a drop across diode 326. Thus, inserting inverters, such as inverters 308 and 310, in the signal path from circuit block 304 to circuit block 306, and placing these inverters (i.e. inverters 308 and 310) close to the transmitting or receiving gate, such as respective inverters 312 and 313, greatly lowers gate oxide stress for power domain to power domain interface circuits. Note that if the signal from inverter 312 was terminated in digital circuit block 306 with a plurality of receiving circuit gates, inverter 313 would be used as a receiving buffer with its output going to the plurality of receiving gates in digital circuit block 306. Thus, the strategic distribution of buffer inverters in the signal path lowers the voltage stress any gate oxide experiences in an ESD event.

Figure 4:
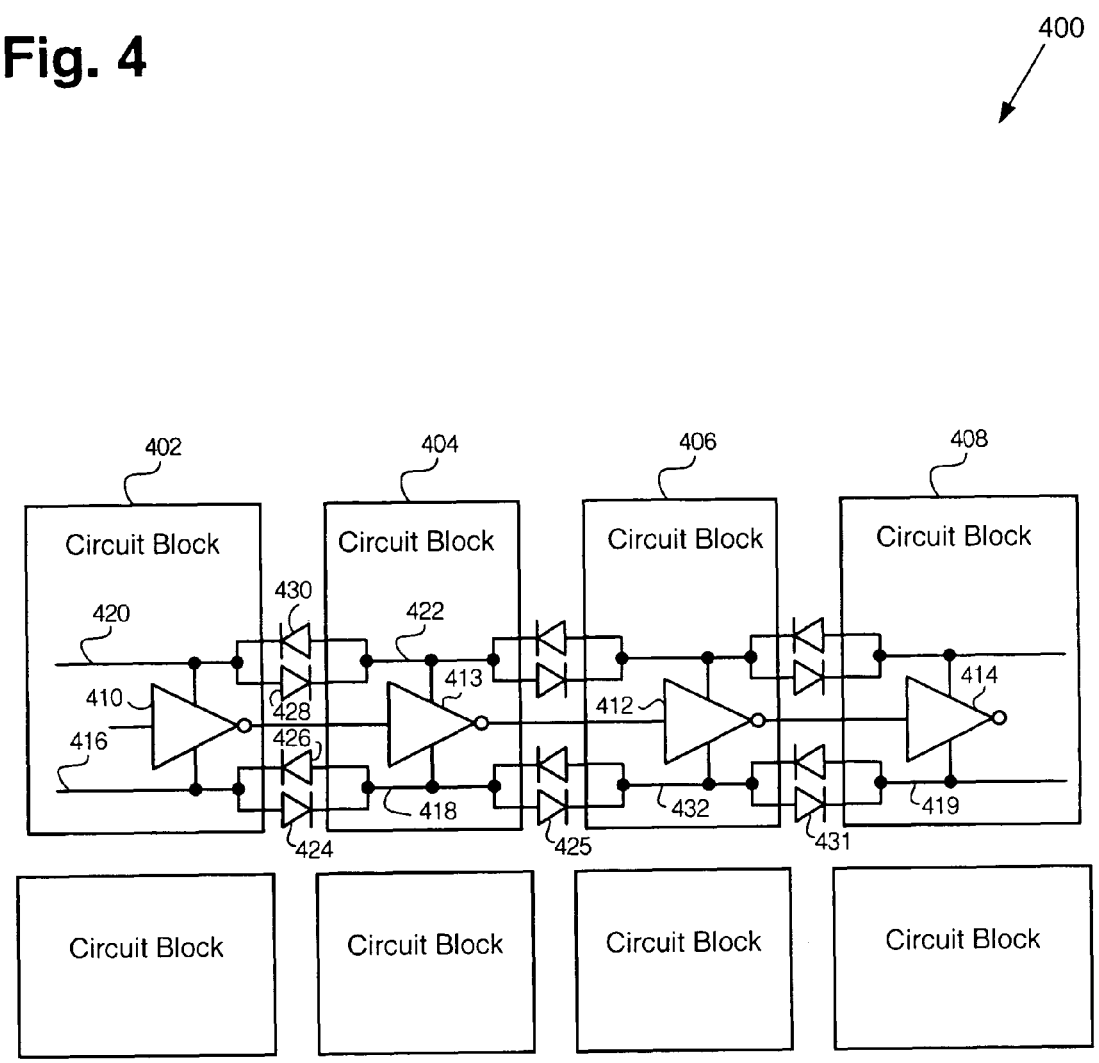
FIG. 4 illustrates a circuit diagram of exemplary interconnected circuit blocks in an integrated circuit in accordance with one embodiment of the present invention.

FIG. 4 shows a diagram of an exemplary circuit having no adjacent "third party" circuit block that spans the distance between a signal transmitting circuit block and a receiving circuit block, in accordance with one embodiment of the present invention. In circuit 400, which can be a portion of an IC, a signal is transmitted from circuit block 402 to circuit block 408 through intervening circuit blocks 404 and 406 using receivers and transmitters at circuit block boundaries. Normal design practices would use a transmitting inverter 410 in block 402 with a signal line running directly to a receiving inverter 414 in block 408. For this case an ESD discharge from Vss power bus 416 to Vss power bus 419 would involved exposing the input gate oxide of inverter 414 to the sum of the voltage drops of 3 diodes, i.e. diodes 424, 425, and 431, and the sum of the IR voltage drops of Vss power buses 418, 432, and 419.

However, as in the embodiment of the present invention in FIG. 4, the voltage difference between the Vss power bus of the transmitting circuit, such as Vss power bus 416 of circuit block 402, and the Vss power bus of the receiving circuit, such as Vss power bus 418 of circuit block 404, is only one diode drop, i.e. a drop across diode 424 or diode 426, depending on the ESD discharge polarity. Similarly, the corresponding voltage difference of the two Vdd power buses, such as Vdd power bus 420 in circuit block 402 and Vdd power bus 422 in circuit block 404, is only one diode drop, i.e. a drop across diode 428 or 430. At most, the input gate oxide of inverters 413, 412, and 414 in the signal path from inverter 410 to inverter 414 will see the voltage drop of one diode and one bus IR drop, not 3 diode drops and 3 bus IR drops as in the case of the normal design practice. Thus, the ESD discharge voltage developed from Vss power bus 416 to Vss power but 419 is distributed among the input gate oxides of 3 inverters, i.e. inverters 413, 412, and 419, and not just one.

Figure 5:
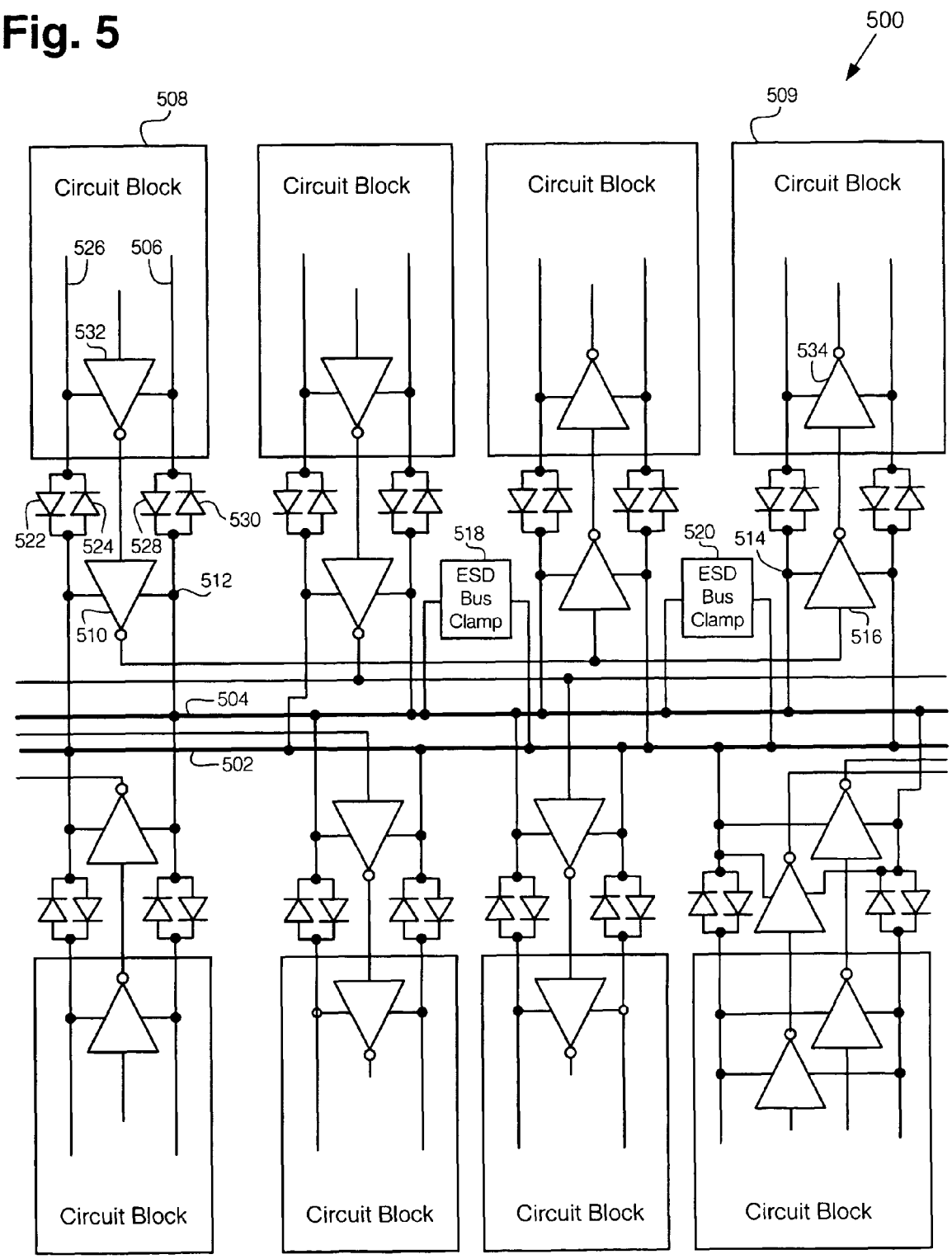
FIG. 5 illustrates a circuit diagram of exemplary circuit blocks interconnected by an exemplary ESD bus network in accordance with one embodiment of the present invention.

FIG. 5 shows a diagram of an exemplary circuit in which the power bus for the transmitting circuit gate is local to the power bus of the receiving gate, in accordance with one embodiment of the present invention. In circuit 500, which can be a portion of an IC, inverter 532 in circuit block 508 is coupled to inverter 510, inverter 510 is coupled to inverter 516, and inverter 516 is coupled to inverter 534 in circuit block 509. It is noted that in FIG. 5, inverters 510 and 516 are situated external to circuit blocks 508 and 509. In circuit 500, a dedicated Vss ESD bus, i.e. Vss ESD bus 502, and a dedicated Vdd ESD bus, i.e. Vdd ESD bus 504, are used. The dedicated ESD buses, i.e. Vss ESD bus 502 and Vdd ESD bus 504, have power applied to them, which allows the transmitting and receiving circuit gates to be located near each other with bi-directional coupling diodes used to couple the various power buses of the circuit blocks to Vss ESD bus 502 and Vdd ESD bus 504. Also, Vss ESD bus 502 and Vdd ESD bus 504 can be operated at higher voltages so that high voltage drivers can be used to send a signal from one block to another. In most integrated circuits, high voltage transistors are provided for I/O circuits while low voltage transistors are used for interior logic. For example, in a 0.13 μm process the interior logic transistors use MOSFETs with 20.0 Å oxides that operate at 1.2V, whereas the I/O circuits use MOSFETs with 65.0 Å oxides that operate at 3.3V. Thus, if Vdd ESD bus 504 is 3.3V and Vdd power bus 506 in circuit block 508 is 1.2V, then inverter 510 would be a level-shifting gate.

The advantage in using high voltage transistors to transmit the signals between blocks is that the resistance of Vdd ESD bus 504 and the resistance of Vss ESD bus 502 can be on the order of several ohms from the transmitting point to the receiving point. Thus, the resistance from Vdd node 512 of inverter 510 to Vdd node 514 of inverter 516 can be several ohms. For example, if a CDM current for meeting a required specification is 5.0 amperes and 3.3V MOSFETs are used to transmit signals from one block to another, then for 65.0 Å of gate oxide, the maximum voltage drop of either Vss ESD bus 502 or Vdd ESD bus 504 is approximately 36.0V. Thus, the resistance of Vss ESD bus 502 and/or Vdd ESD bus 504 can be as high as 36.0V/5.0 amperes or 7.2Ω. If low voltage transistors are used to transmit and receive the block-to-block signals in circuit 500 in FIG. 5 and the low voltage transistors have an assumed oxide thickness of 20.0 Å, then the breakdown voltage would be about 10.0V for a CDM pulse. This translates to a maximum point-to-point resistance of 2.0Ω for each of the two ESD buses, i.e. Vss ESD bus 502 and Vdd ESD bus 504.

Also, ESD bus clamps, such as ESD bus clamps 518 and 520, can be located in the ESD bus region and connected between Vss ESD bus 502 and Vdd ESD bus 504. Additionally, because of the bi-directional diode clamps situated between the block power buses and ESD buses, the ESD bus clamps are shared with the block power buses, thereby creating shunt paths between the Vdd power buses and Vss power buses of the circuit blocks. For example, a bi-directional diode clamp comprising diodes 522 and 524 is situated between Vss power bus 526 of circuit block 508 and Vss ESD bus 502 and a bi-directional diode clamp comprising diodes 528 and 530 is situated between Vdd power bus 506. Thus, ESD bus clamp 518 creates a shunt path between Vdd power bus 506 and Vss power bus 526 of circuit block 508. Thus, the ESD bus network including bus coupling diodes, interface circuit gates, and power bus clamps is placed between circuit blocks as shown in circuit 500 in FIG. 5 and is used as a routing channel for signal lines that go between circuit blocks having independent power buses.

Figure 6:
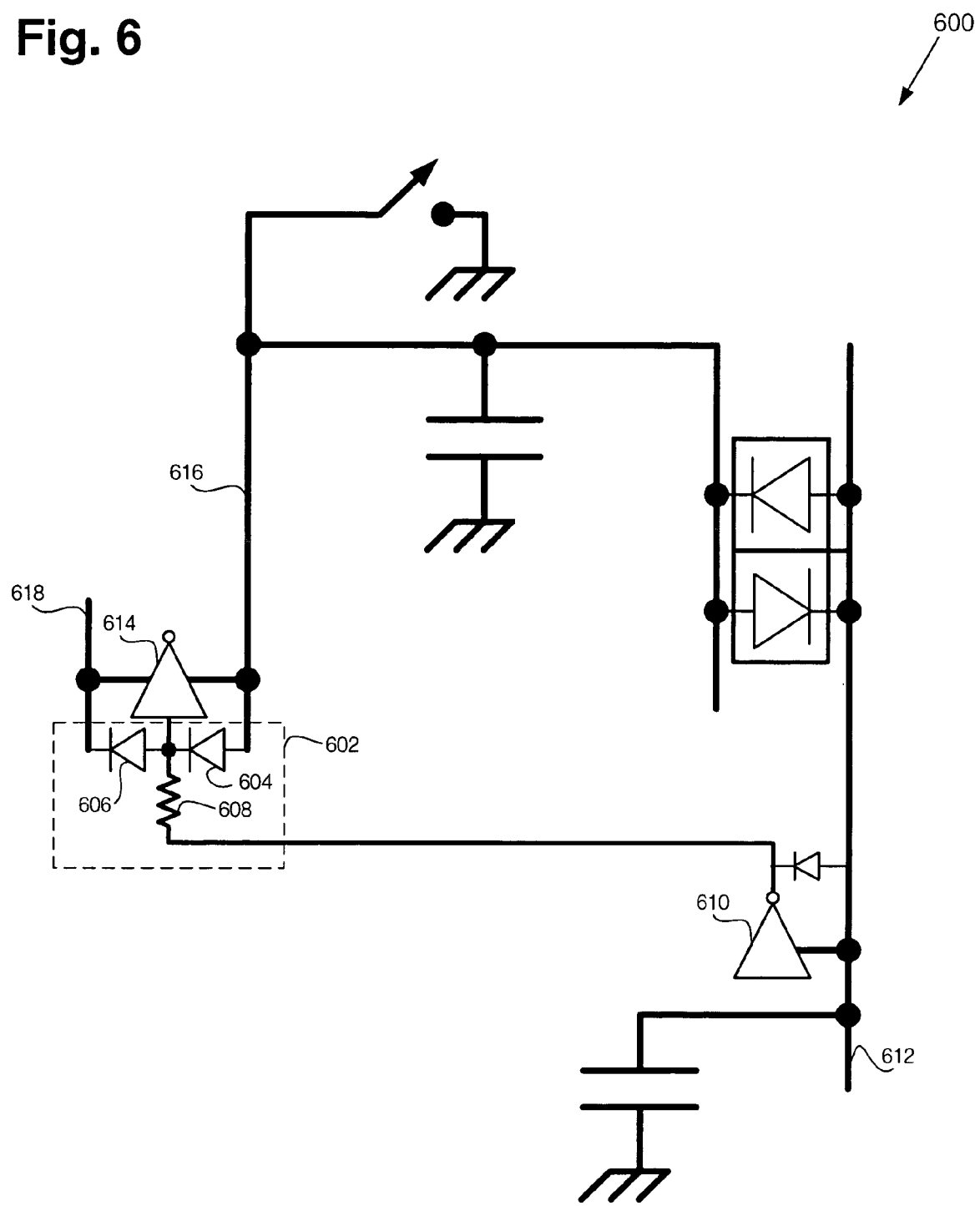
FIG. 6 illustrates a circuit diagram of an exemplary ESD circuit situated between two circuit blocks in an integrated circuit in accordance with one embodiment of the present invention.

FIG. 6 shows a diagram of a circuit including an exemplary resistor-clamp network situated between two power domains in accordance with one embodiment of the present invention. In FIG. 6, only a portion of circuit 600 that includes the present invention's resistor-clamp network, i.e. resistor-clamp network 602, is discussed in detail herein to preserve brevity. Other portions of circuit 600 have been discussed above in relation to circuit 100 in FIG. 1. In circuit 600 in FIG. 6, resistor-clamp network 602, which is also referred to as an "ESD network" in the present application, includes diodes 604 and 606 and resistor 608. In circuit 600, resistor-clamp network 602 is situated between the output of inverter 610, which is situated in a circuit block having Vss power bus 612, and the input of inverter 614, which is situated in a circuit block having Vss power bus 616, where Vss power bus 612 is isolated from Vss power bus 616. In resistor-clamp network 602, diode 604 is situated between the input of inverter 614 and Vss power bus 616, diode 606 is situated between the input of inverter 614 and Vdd power bus 618, and resistor 608 is situated between the output of inverter 610 and the input of inverter 614. In resistor-clamp network 602, diodes 604 and 606 can be replaced by NFET snap-back devices if the trigger voltage is below the gate oxide rupture voltage.

By utilizing TLP plots of P type polycrystalline silicon (poly) resistors, i.e. poly resistors doped with a P type dopant, as well as plots of failure voltage for poly resistors having various geometries, it was determined that for both HBM and CDM, the voltage tolerance of a poly resistor-diode clamp is determined by the failure point of the resistor, i.e. resistor 608, and not the oxide for a range of practical resistor values and clamp diode sizes. Adiabatic heating equations for poly were also used to determine the CDM failure point with snap-back or second breakdown being defined as the failure point. Using a conversion factor of 2.0 kV HBM/2.0 amperes TLP, it was determined that for a poly resistivity of 360.0 Ω/square (salicide blocked), the peak HBM failure voltage is given by:

$$V_{failHBM}=3.22 L_{poly}+3.43 \qquad \text{Equation (3)}$$

where L is in microns. Equation (3) can be converted to other poly resistivities (ρ) by multiplying the first coefficient of Equation (3) by $\sqrt{\rho/360}$.

The present invention thus reduces the high susceptibility of ultra thin gate oxides at power domain interfaces to CDM and HBM failures. According to the invention, by locating transmitting and receiving interface logic of different power domains near each other with a locally placed back-to-back diode clamp between power buses of the domains and by not permitting signals external to a domain from propagating into a circuit block without buffering at the boundary, oxide stress during an ESD event is significantly reduced. Also, distributing circuit gates in a signal path can greatly reduce oxide stress. In an embodiment of the present invention in FIG. 5, an inter-domain architecture is used that has excellent noise isolation and low oxide stress. This architecture can also make use of high voltage transistors to greatly reduce internal ESD susceptibility. In an embodiment of the present invention in FIG. 6, resistor-clamp networks are utilized in which the voltage limit is controlled by a poly resistor and not the oxide breakdown. Design equations for the poly resistor failure point were utilized for both CDM and HBM with the CDM equations being based on adiabatic heating and the HBM equations being based on TLP data.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, ESD protection for integrated circuits having ultra thin gate oxides has been described.

The invention claimed is:

1. An integrated circuit comprising:
   a first circuit block having a first power bus and a first inverter situated in said first circuit block;
   a second circuit block having a second power bus and a second inverter situated in said second circuit block, said second inverter being coupled to said first inverter, said second power bus being isolated from said first power bus;
   a digital block having a digital block power bus, said digital block being separated from said first circuit block and said second circuit block, said digital block being configured to transmit a signal from said first circuit block to said second circuit block;
   wherein said first power bus and said second power bus are coupled to said digital block power bus.

2. The integrated circuit of claim 1 wherein said first power bus is coupled to said digital block power bus by a first pair of bi-directional diodes.

3. The integrated circuit of claim 2 wherein said second power bus is coupled to said digital block power bus by second pair of bi-directional diodes.

4. The integrated circuit of claim 1 wherein said digital block further comprises a third inverter coupled to a fourth inverter, wherein said third inverter and said fourth inverter are coupled to said digital block power bus, wherein an input of said third inverter is coupled to said first circuit block and an output of said fourth inverter is coupled to said second circuit block.

5. The integrated circuit of claim 4 wherein said first inverter is coupled to said first power bus, wherein an output of said first inverter is coupled to said input of said third inverter.

6. The integrated circuit of claim 4 wherein said second inverter is coupled to said second power bus, wherein an input of said second inverter is coupled to said output of said fourth inverter.

* * * * *